(12) United States Patent
Nielsen

(10) Patent No.: US 7,936,216 B2
(45) Date of Patent: May 3, 2011

(54) TRUE CURRENT LIMITING

(75) Inventor: Ole Neis Nielsen, Copenhagen (DK)

(73) Assignee: Bang & Olufsen ICEpower a/s, Kgs. Lyngby (DK)

( * ) Notice: Subject to any disclaimer, the term of this patent is extended or adjusted under 35 U.S.C. 154(b) by 0 days.

(21) Appl. No.: 12/519,472

(22) PCT Filed: Dec. 20, 2007

(86) PCT No.: PCT/IB2007/055247
§ 371 (c)(1),
(2), (4) Date: Oct. 15, 2009

(87) PCT Pub. No.: WO2008/075306
PCT Pub. Date: Jun. 26, 2008

(65) Prior Publication Data
US 2010/0033247 A1 Feb. 11, 2010

(30) Foreign Application Priority Data
Dec. 20, 2006 (DK) .................................. 2006 01680

(51) Int. Cl.
*H03F 3/217* (2006.01)
(52) U.S. Cl. ............................. 330/251; 330/10; 330/298
(58) Field of Classification Search .................... 330/10, 330/251, 207 A, 298
See application file for complete search history.

(56) References Cited

U.S. PATENT DOCUMENTS

| 4,415,863 | A | | 11/1983 | Tokumo |
| 5,973,569 | A | * | 10/1999 | Nguyen ......................... 330/298 |
| 6,108,182 | A | | 8/2000 | Pullen |
| 6,469,575 | B1 | | 10/2002 | Oki et al. |
| 7,317,355 | B2 | * | 1/2008 | Zhao et al. ..................... 330/251 |
| 7,595,615 | B2 | * | 9/2009 | Li et al. ......................... 323/277 |

OTHER PUBLICATIONS

Berkhout M: "Integrated Overcurrent Protection System for Class-D Audio Power Amplifiers", IEEE Journal of Solid-State Circuits, IEEE Service Center, Piscataway, NJ, US, vol. 40, No. 11, (Nov. 1, 2005), pp. 2237-2245.
International Rectifier, "Data Shet PD60303 IRS20955(S)PbF Protected Digital Audio Driver", Data Sheet, (Dec. 11, 2006), pp. 1-21.

* cited by examiner

*Primary Examiner* — Hieu P Nguyen
(74) *Attorney, Agent, or Firm* — Stites & Harbison PLLC; Douglas E. Jackson

(57) ABSTRACT

The invention relates to a current limiting method, e. g. for Class D amplifiers comprising a unique detection- and control method. The current detection circuit can be implemented as a voltage measurement where the measured voltage corresponds to the current flowing through the power-switching device. The device can be switched OFF when a set limit is reached. By forcing certain OFF time, the associated control system behaves as a self-oscillating current limiting circuit. This can be implemented locally close to the switching device and be independent of other local or global control systems.

11 Claims, 3 Drawing Sheets

TRUE CURRENT LIMITING

TECHNICAL FIELD

This invention relates to current detection, current monitoring and current limiting in Audio Power Conversion systems using Switch Mode Techniques also known as Class D audio amplifiers.

The invention is especially useful in self-oscillating Class D amplifiers.

TECHNICAL BACKGROUND

In traditional Class AB audio amplifiers, current limiting of the output signal is easily implemented and a standard feature. This feature serves as a protection feature in case of a short circuit of the amplifier output terminals, but also as a current clipping feature. The benefit of the current clipping feature is that the audio amplifier will continue playing music even in case of an impedance-dip in the transducer or at local maximum of the music material. In the audio amplification it is seldom accepted to have a latched shutdown or a temporary shutdown in case of an over-current situation. Music at all time is very important and often a requirement.

In Class D audio amplifiers, the current protection/clipping is somewhat more difficult to implement because of the switching nature of these amplifiers. It becomes increasingly difficult if cycle-by-cycle current limiting without shutdown is needed. For clocked Class D audio amplifiers, the over-current and clipping feature can be implemented using well-known current-limiting methods known from switched mode power supply design. Using this method, also known as Current Programmed Control (CPC), the cycle-by-cycle current-limiting feature enables current clipping as known from Class AB audio amplifiers.

In case of voltage-controlled self-oscillating Class D amplifiers, the standard current programmed control scheme can only be used as latched shutdown or restart after over-current detection. The cycle-by-cycle current limiting is not possible using the standard methods. Therefore, in voltage-controlled self-oscillating Class D amplifiers, the current clipping feature is not an option. For the voltage-controlled self-oscillating Class D amplifiers, the voltage loop during an over-current event will saturate and all switching action will stop. This results in holes in the audio signal and noisy restart phenomena caused by recovery from saturation.

Besides the considerations regarding using the right current limit strategy, the current detection method can also give rise to certain problems.

The most popular and inexpensive way to measure the current is by adding a sense resistor in the power path. The current limit is then reached when the voltage across the sense resistor reaches a predetermined value. The most significant drawback of this method is the power loss associated with this method. Adding a sense resistor in the power path will contribute to a larger switching loop with the associated drawbacks of larger EMI pollution. For small power amplifiers, the losses and the added power path loop are usually manageable but for higher power levels, the power dissipation and the increased switching loop become a severe problem.

To manage the higher power levels, current sense transformers can be used. This approach will take care of the power loss problem and reduce the size of the switching loop, but the cost is increased. Furthermore, it is not in all applications that this approach is manageable because of saturation phenomena in the current transformer.

A hall-sensor can also be used to measure the current and this approach will solve the saturation problem of the current transformer. The disadvantage of this method is the cost, particularly because of the high demand on the hall-sensor in terms of bandwidth.

In general all of the above-mentioned current sense methods interrupt the power path which in this switching environment can give rise to EMI problems Also the location of the current sense object can give rise to trouble—especially if sense resistors are used. Typically the best location for the sense device is also the most difficult location for the detection circuitry to interface to; hence the use of expensive operational amplifiers is often required.

OBJECTS OF THE INVENTION

It is the objective of the invention to provide a control method and means to detect and limit the amplifier load current in such a way that the following objectives are achieved:
1) True Amplifier Current Clipping, by introducing a new current-limit control method.
2) Improved reliability and Robustness, since the current detection method can be implemented locally around the switching semiconductor devices acting in an autonomous way independent of control loop dynamics and there is no need for difficult high-side communication.
Furthermore, the current-limit scheme provides automatically SOA adjustment (Safe Operation Area).
3) Circuit Integration (IC-friendly), by eliminating the external sense device in the power path, the invention is primed for integration.
4) Reduced complexity, by eliminating the external sense device in the power path.
5) Improved efficiency, since there is no sense device added in the power path that can give rise to power losses.
6) Improved EMI performance, by eliminating the external sense device, the switching loops can be optimized for best EMI performance.

SUMMARY OF THE INVENTION

The objects of the invention are achieved by:
1) Introducing a new current-limiting control scheme or method that acts locally and independently of other amplifier control loops. This control scheme is referred to as the True Current Limit scheme (TCL).
2) A current detection method that enables the TCL control scheme.

The proposed current detection method according to the invention is implemented locally around each controlled switching device (MOSFET). The current limit is set by a predetermined reference that Corresponds to the application and to the applied switching device.

In a first preferred embodiment, the current limiting is implemented as a self-oscillating circuit, provided locally around the switching device. In this self-oscillating current mode, the power stage is independent of all other control loops and acts only according to the current limit setting.

In a second preferred embodiment, the self-oscillating current limiting loop is implemented by assuring a fixed transistor off time.

In a third and fourth preferred embodiment, the current limit is detected by using a comparator circuit. After a detection of an over-current situation, the output of the comparator changes to a new state which is held for a predetermined time period, e.g. 1.25 microseconds.

In a fifth preferred embodiment, the transistor driver circuit turns off the switching device according to the output state of the comparator circuit.

In a sixth preferred embodiment, the current limiting detection is done directly across the switching device by sensing the voltage drop across the device.

In a seventh preferred embodiment, the voltage sensing is done by an arrangement of diodes, current-sources and additional circuitry to measure and detect the voltage drop across the switching device.

In an eight preferred embodiment of the invention, the current limiting and sensing scheme does not need to communicate with the global control system.

In an ninth preferred embodiment of the invention, the means to measure and detect the current is integrated with the driver stage and the current limit control into the same chip (IC-Integrated Circuit).

BRIEF DESCRIPTION OF THE DRAWINGS

The invention will be better understood with reference to the following detailed description of embodiments hereof in conjunction with the drawings, where.

DETAILED DESCRIPTION OF THE PREFERRED EMBODIMENTS

Figure 1:
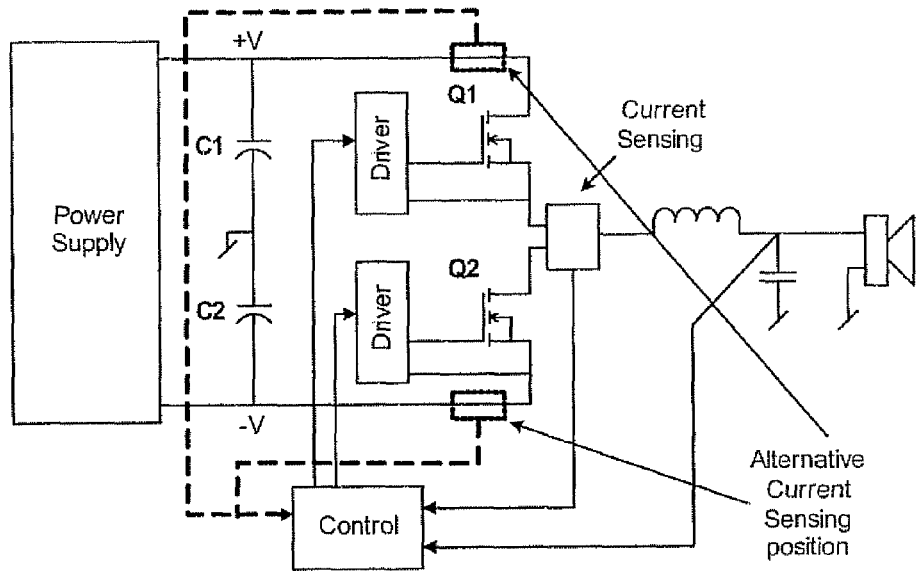
FIG. 1 shows prior art implementations of current limiting schemes in a single-ended Class D amplifier. The current information is typically feedback to the global control unit, which in case of an over-current situation signals the driver stages to shutdown.
Figure 2:
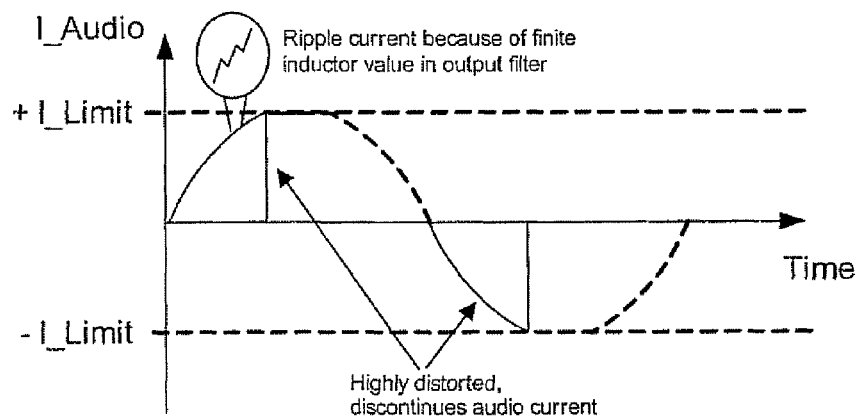
FIG. 2 shows a prior art example of the audio current in case of an over-current situation. Especially for self-oscillating systems, an over-current situation will result in a semi-permanent shutdown until the global control system has recovered. The resulting audio-current will be highly distorted and discontinues.

According to the invention, the current limiting scheme and method provide a self-oscillating controlled current limiting mode.

After detecting an over-current situation, the driver 16 to the output switching stage 17 is forced to turn OFF the output stage. If the over-current is detected, the control circuitry according to the invention will force a predetermined OFF time. This OFF time could be implemented in the comparator 6 used in the detection circuit. After the forced shutdown, the output stage is able to turn ON again according to the PWM signal 13 to the driver stage. If the over-current situation is still present, the current in the switching device 17 will ramp up to the current limit 22 and the output stage will be turned OFF again for the duration of the forced OFF time 23. Thereby, the output stage will enter the self-oscillating controlled current limiting mode with a switching frequency given by $(T\_ON\ (24)+T\_OFF\ (23))^{-1}$.

The self-oscillating controlled current limiting mode results in a self-oscillating current loop that cycle-by-cycle limits the current level and keeps the audio output intact but clipped. During this current-limit action, the amplifier control-loops will be saturated, which in the prior art stopped all switching action and caused unwanted audio artefacts.

Figure 3:
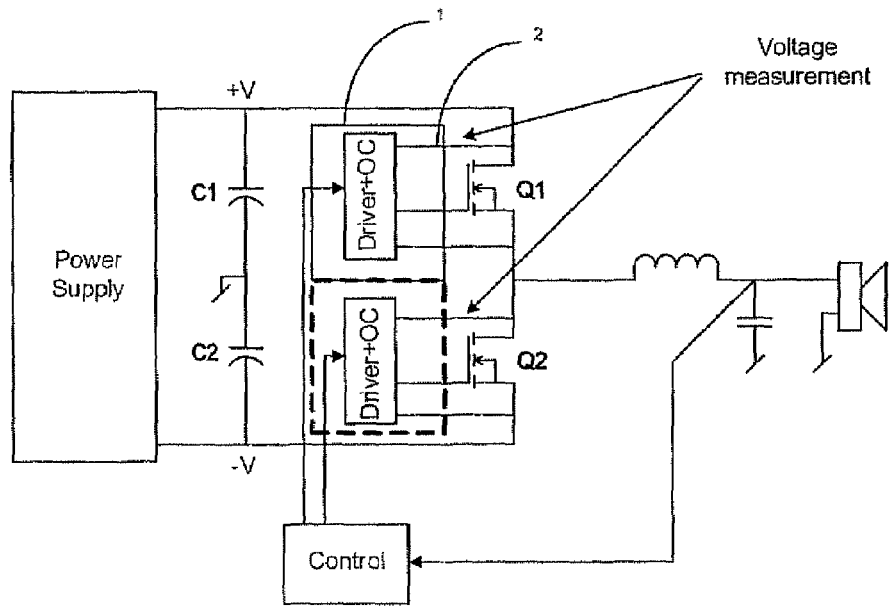
FIG. 3 shows the output stage of a single-ended Class D amplifier, according to the invention, using a self-oscillating controlled current limiting scheme. The current detection is done locally by measuring the voltage drop across the switching device.
Figure 4:
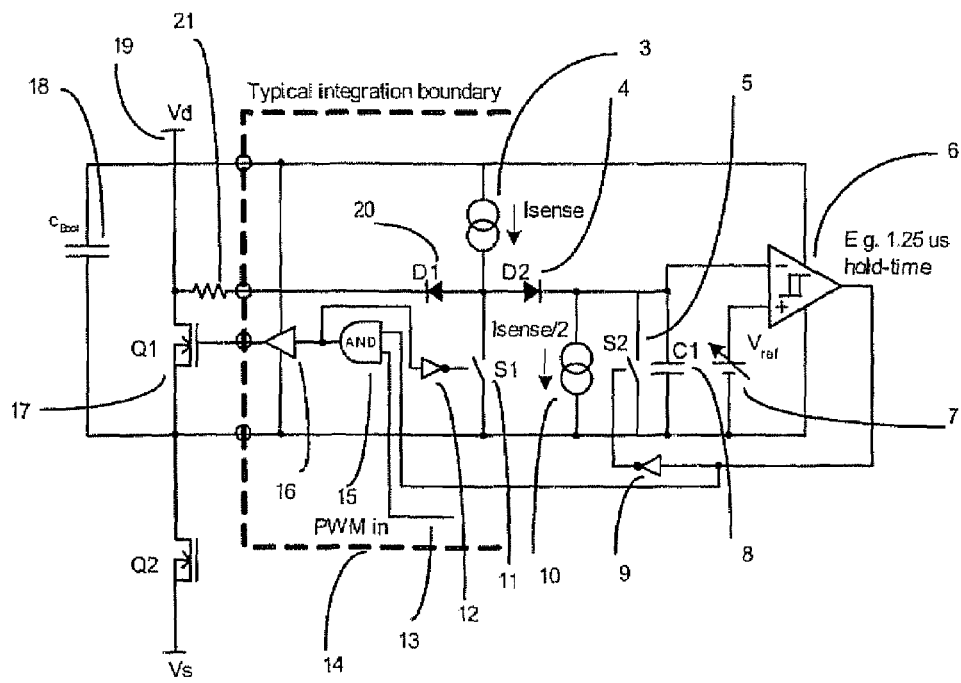
FIG. 4 shows a preferred implementation according to the invention.
Figure 5:
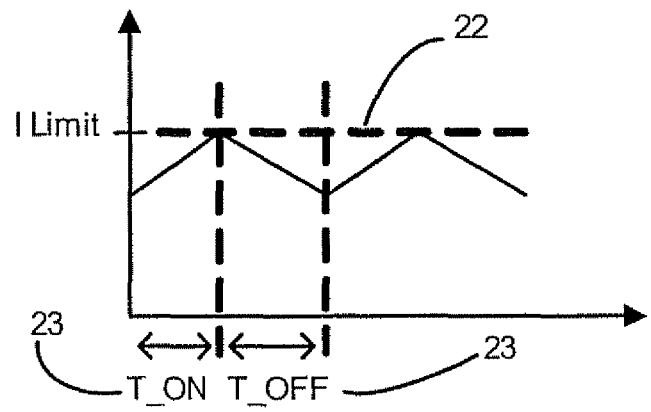
FIG. 5 shows an example of the current waveform when the output stage is in the self-oscillating controlled current limiting mode. The resulting switching frequency is given by $(T\_ON+T\_OFF)^{-1}$.
Figure 6:
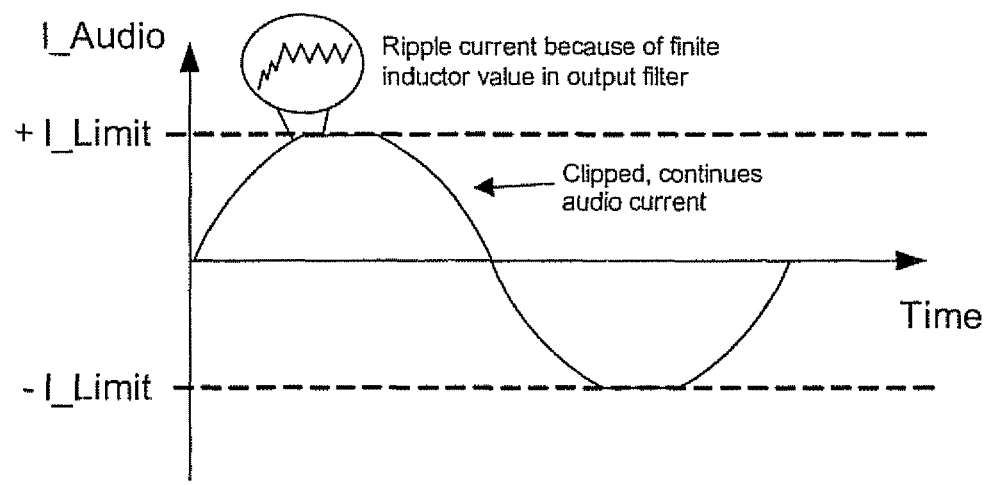
FIG. 6 shows the audio current as a result of using the invention. The audio current is clipped, but no longer discontinued and by using the invention, the amplifier output stage is able to deliver "Music at all time".

When the amplifier goes into the self-oscillating controlled current limiting mode, there is no communication with the global control loop. This is advantageous since any communication with the low- and high-side drivers is complicated. Even though there is no communication, it is still very easy to determine if the system is in current limiting mode. It is often required that current limiting is monitored and that the information can be displayed. By comparing the PWM-pulses in the power stage (Junction between Q1 and Q2 in FIG. 4) with the global control loop, one can determine in which state the amplifier is. If the global feedback control circuit (FIG. 3) is saturated and PWM-pulses in the power stage are detected, then the amplifier is in the self-oscillating controlled current limiting mode.

The current detection method according to the invention eliminates the need for an external sense device. Instead, the voltage across the FET transistor is used as a measure of the current through it.

In a Class D amplifier (as for any Switch Mode circuit), the FET transistors are either fully turned ON or fully turned OFF, and ON characteristics are predominantly resistive. The invention takes advantage of this resistive nature of the FET transistors when turned ON and can by means of the invention sense the voltage across the MOSFET and thereby the current.

It is not trivial to measure the voltage drop across a switching MOSFET. A direct measurement of the voltage drop across the device will require critical timing with regard to connection/disconnection of the probe circuitry in order to avoid destructive voltages when the switching device is in its off state. The invention presents a new-to-the-art way of sensing the voltage across the switching device by using a special network and a sense current (3+10) to give information about the voltage across the device and thereby the current flowing through it.

In a preferred embodiment of the invention, the sense current is divided into two equal parts taking two different paths. The first path goes through a diode 20 connected to the switching device 17, and the second path goes through a similar diode 4 to a capacitor 8. Since the two diodes are essentially equal, the voltage across the capacitor 8 will track the voltage across the switching device. During the OFF time of the switching device, the sense-current is bypassed by a switch 11 to avoid wrongful charging of the sense capacitor 8. The sense voltage across capacitor 8 is the input to a comparator 6. The input to the positive terminal of the comparator 6 is a voltage-reference 7. This voltage reference 7 can be a fixed voltage or an adjustable voltage. By implementing an adjustable voltage reference, the current limit level can be changed by adjusting the voltage 7. Another way of controlling the current limit setting is by adding a resistor 21 in series with the diode D1 20. Instead of having the detection voltage drop solely across the switching device, part of the drop will now be across the resistor 21. This will effectively reduce the current limit setting.

In case that the detection voltage across capacitor C1 8 reaches the reference voltage 7, the output of the comparator will change state which indicates an over-current situation. In case of an over-current situation, the comparator 6 output state will force the driver stage 16 to shut down the switching device. According to the invention, the comparator will have a built-in forced hold time, e.g. 1.25 microseconds, in case of an over-current situation. After the forced hold time, the switching device can be turned ON again. If the over-current situation is still present, the switching device is turned OFF again for the duration of the forced hold time. By doing this, the current protection scheme transforms the output stage to a self-oscillating controlled current limiting loop.

The invention claimed is:

1. A method for current sensing and current limiting in a self-oscillating class D amplifier comprising a Pulse Width Modulator, a driver circuit, one or more output switching semiconductors and a global control system, the method comprising the steps of:
   a) current sensing directly across terminals of said one or more output switching semiconductors;
   b) current limiting by use of a local autonomously controlled self-oscillating loop, the loop comprising a comparator with a reference level and a detection level as inputs and an output for controlling said driver circuit; and
   c) creating, with an arrangement of current sources, diodes and detection circuitry, one current path divided into two equal current paths, whereof the first current path detects a voltage across the one or more output switching semiconductors and consequently a voltage across the second current path reflects the hereby detected voltage and is equal to the voltage across the one or more output switching semiconductors.

2. A method for current sensing and current limiting according to claim 1, where the current limiting action is characterized by said driver circuit turning off said one or more output switching semiconductors upon an over-current detection.

3. A method for current sensing and current limiting according to claim 1, where the current limiting action is characterized by a fixed OFF time for said one or more output switching semiconductors.

4. A method for current sensing and current limiting according to claim 1, where the current limiting action is characterized by an asynchronously determined time for switching OFF for said one or more output switching semiconductors.

5. A method for current sensing and current limiting according to claim 1, characterized by said comparator changing output state according to the reference level and the detection level.

6. A method for current sensing and current limiting according to claim 1, characterized by said comparator having a forced hold time.

7. A method for current sensing and current limiting according to claim 1, characterized by the current sensing and current limiting action having no communication with said global control system.

8. A method for current sensing and current limiting according to claim 1, wherein the method is implemented on an integrated circuit.

9. A self-oscillating class D amplifier comprising a Pulse Width Modulator, a driver circuit, one or more output switching semiconductors and a global control system, where said self-oscillating class D amplifier further comprises:
   a) means for current sensing directly across terminals of said one or more output switching semiconductors;
   b) an arrangement of current sources, diodes and detection circuitry, creating one current path divided into two equal current paths, whereof the first current path detects a voltage across the one or more switching semiconductors and consequently a voltage across the second current path reflects the thereby detected voltage and is equal to the voltage across the one or more switching semiconductors;
   c) a local autonomously controlled self-oscillating loop comprising a comparator circuit with a reference level and a detection level as inputs and an output for controlling said driver circuit; and
   d) means for current limiting where said comparator circuit asynchronously controls said driver circuit at a fixed OFF time.

10. A self-oscillating class D amplifier according to claim 9, further comprising: a current detecting and limiting system having no communication with said global control system.

11. A self-oscillating class D amplifier according to claim 10, further comprising: a current detecting and limiting system integrated into a chip.

* * * * *